(12) United States Patent
Vijh

(10) Patent No.: US 11,075,128 B2
(45) Date of Patent: Jul. 27, 2021

(54) MODULES INCORPORATING ENCAPSULATION LAYERS

(71) Applicant: UTICA LEASECO, LLC, Rochester Hills, MI (US)

(72) Inventor: Aarohi Surya Vijh, Cupertino, CA (US)

(73) Assignee: UTICA LEASECO, LLC, Rochester Hills, MI (US)

(*) Notice: Subject to any disclaimer, the term of this patent is extended or adjusted under 35 U.S.C. 154(b) by 0 days.

(21) Appl. No.: 16/592,124

(22) Filed: Oct. 3, 2019

(65) Prior Publication Data
US 2021/0104444 A1  Apr. 8, 2021

(51) Int. Cl.
*H01L 21/66*  (2006.01)
*H01L 31/048*  (2014.01)
*H01L 33/52*  (2010.01)

(52) U.S. Cl.
CPC ............ *H01L 22/20* (2013.01); *H01L 31/048* (2013.01); *H01L 33/52* (2013.01); *H01L 2924/01079* (2013.01); *H01L 2924/14* (2013.01)

(58) Field of Classification Search
CPC ....... H01L 22/20; H01L 31/048; H01L 33/52; H01L 2924/01079; H01L 23/203
USPC ......... 257/787, 788, 789; 438/112, 124, 127
See application file for complete search history.

(56) References Cited

U.S. PATENT DOCUMENTS

| | | | |
|---|---|---|---|
| 2004/0027327 A1 | 2/2004 | LeCain et al. | |
| 2005/0224829 A1* | 10/2005 | Negley et al. | ......... H01L 33/52 257/99 |
| 2007/0153361 A1 | 5/2007 | Danner et al. | |
| 2016/0172545 A1 | 6/2016 | Engl et al. | |
| 2017/0141354 A1 | 5/2017 | Bonnet et al. | |

FOREIGN PATENT DOCUMENTS

DE   10 2017107707 A1   10/2018

OTHER PUBLICATIONS

International Search Report issued in PCT/CN2020/054010, dated Dec. 15, 2020, pp. 1-2 (English-Translation).
Written Opinion issued in PCT/CN2020/054010, dated Dec. 15, 2020, pp. 1-4 (English-Translation).

* cited by examiner

*Primary Examiner* — Thinh T Nguyen
(74) *Attorney, Agent, or Firm* — Arent Fox LLP

(57) ABSTRACT

Aspects of the present disclosure include a packaged product including a product, a first encapsulation disposed on top of the product, wherein the first encapsulation is configured to protect the product during an operation of the product, a second encapsulation disposed on top of the first encapsulation, wherein the second encapsulation is configured to protect the product during a testing of the product, and a third encapsulation disposed on top of the second encapsulation, wherein the third encapsulation is configured to protect the product during a transport of the product, wherein at least one of the first encapsulation, the second encapsulation, or the third encapsulation is detachably coupled with the product.

20 Claims, 7 Drawing Sheets

MODULES INCORPORATING ENCAPSULATION LAYERS

BACKGROUND

Semiconductor devices, such as solar cells and photovoltaic modules, may be used in many applications. Examples of applications include energy gathering for High Altitude Long Endurance (HALE) vehicles and Unmanned Aerial Vehicles (UAV). However, prior to deployment, the semiconductor devices may go through a variety of fabrication, handling, testing, integration, packaging, and/or transporting processes. The processes may cause damages to the semiconductor devices, lowering their performances or even rendering them unusable. For example, when the semiconductor devices are being tested on the manufacturing floor, they may be subject to manual handling and/or fingerprint contamination, being dropped on the floor, being stretched or bent. During shipping, the semiconductor devices may be subject to abrasion against packaging materials. During installation, the semiconductor devices may be subject to handling, thermal/mechanical/electrical stresses, and/or abrasion. While certain protective packaging devices may be used to protect the semiconductor devices, the packaging devices may add too much weight to weight-sensitive applications such as HALE and/or UAV. Further, some semiconductor devices may be refurbished after a use, which may cause damage due to dust, radiation damage, and/or scratches. Therefore, improvements in protecting semiconductor devices may be desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the present disclosure include a packaged product including a product, a first encapsulation disposed on top of the product, wherein the first encapsulation is configured to protect the product during an operation of the product, a second encapsulation disposed on top of the first encapsulation, wherein the second encapsulation is configured to protect the product during a testing or system integration of the product, and a third encapsulation disposed on top of the second encapsulation, wherein the third encapsulation is configured to protect the product during a transport of the product, wherein at least one of the first encapsulation, the second encapsulation, or the third encapsulation is detachably coupled with the product.

Other aspects of the present disclosure include a packaging including a first encapsulation disposed on top of the product, wherein the first encapsulation is configured to protect the product during an operation of the product, a second encapsulation disposed on top of the first encapsulation, wherein the second encapsulation is configured to protect the product during a testing of the product, and a third encapsulation disposed on top of the second encapsulation, wherein the third encapsulation is configured to protect the product during a transport of the product, wherein at least one of the first encapsulation, the second encapsulation, or the third encapsulation is detachably coupled with the product.

Some aspects of the present disclosure may include a method for packaging a product including receiving a product and installing an encapsulation onto the product.

Certain aspects of the present disclosures may include a method for packaging a product including installing an optional deployment encapsulation, installing a deployment encapsulation, installing a testing encapsulation, and installing a shipping encapsulation.

A non-limiting aspect of the present disclosure may include a method for removing an encapsulation including receiving an encapsulated product and removing an encapsulation from the encapsulated product.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Aspects of the present disclosure includes a plurality of films detachably adhere adhered to a surface of a semiconductor device. The plurality of films may be sacrificial films that are removed after the completion of one or more processes. The plurality of films may have different thicknesses and/or materials. The thicknesses and/or materials may be selected based on the environment the semiconductor device may be exposed to and/or applications for the semiconductor device.

In a non-limiting example, a flexible solar module may incorporate various removable or sacrificial encapsulation layers. The layers may have different properties (including mechanical, chemical, rheological and optical properties). The sequence of layers is chosen such that the solar module is provided with mechanical, environmental and optical properties most suitable to its state of use.

Figure 1:
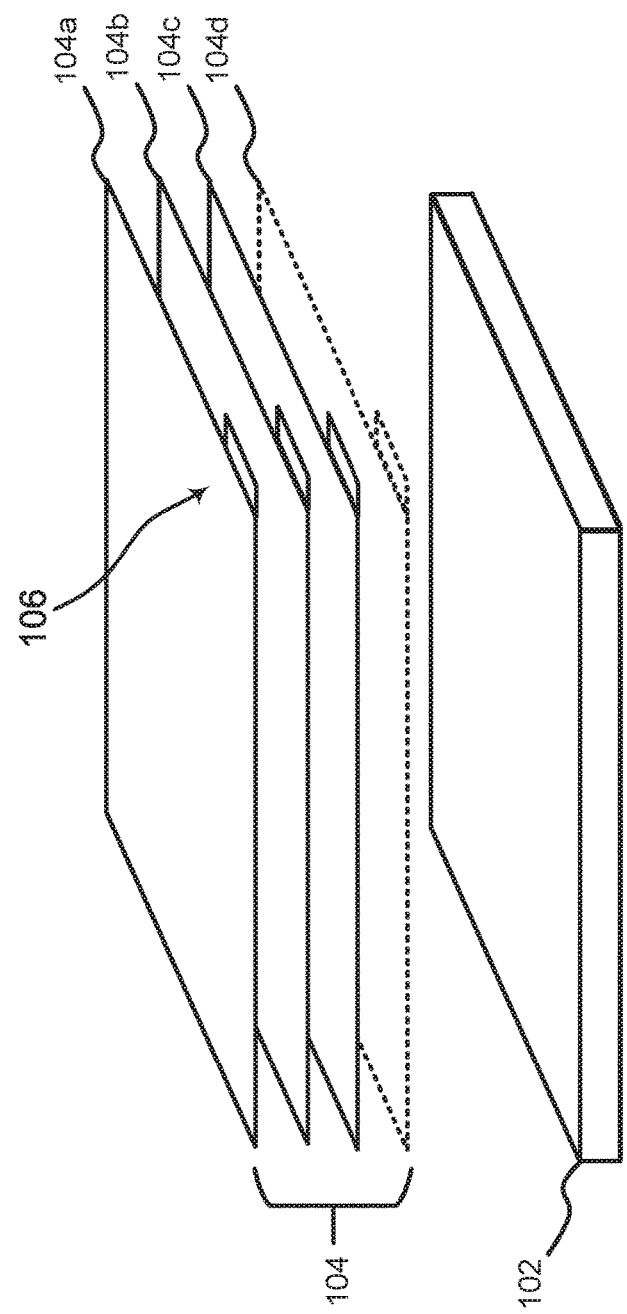
FIG. 1 is a first example of a packaged product according to certain aspects of the present disclosure.

Referring to FIG. 1, an example of an encapsulated product 100 may utilize aspects of the present disclosures to protect a product 102, such as a solar cell, a light emitting diode array, a light emitting diode cell, a display, or other semiconductor and/or optoelectronic devices. In an example, the product 102 may be a solar cell or light emitting diode cell made from group III-IV semiconductor materials, such as such as gallium arsenide, gallium arsenide phosphide, gallium phosphide, aluminum gallium arsenide, aluminum gallium nitride, aluminum gallium indium phosphide, aluminum gallium indium nitride, aluminum gallium, aluminum phosphide, aluminum nitride, zinc selenide, indium gallium nitride, indium gallium arsenide, silicon carbide, or other elemental, molecular (e.g., II-VI or III-V compounds), or organic semiconductors.

In some implementations, the encapsulated product 100 may include a plurality of encapsulations 104. The plurality of encapsulations 104 may include one or more of a shipping encapsulation 104a, a testing encapsulation 104b, a deployment encapsulation 104c, and an optional deployment encapsulation 104d. The plurality of encapsulations 104 may be installed sequentially. For example, the optional deployment encapsulation 104d may be deposited first, the deployment encapsulation 104c may be deposited second, the testing encapsulation 104b may be deposited third, and the shipping encapsulation 104a may be deposited fourth. In other examples, the plurality of encapsulations 104 may detachably adhere to the product 102 at the same time.

In a non-limiting example, the plurality of encapsulations 104 may include a plurality of tabs 106. The plurality of tabs 106 may enable the removal of one or more of the plurality of encapsulations 104 from the encapsulated product 100.

In some aspects of the present disclosure, the plurality of encapsulations 104 may have different thicknesses. For example, the shipping encapsulation 104a may be 0.1 millimeter (mm), 0.2 mm, 0.5 mm, 1, mm, 2 mm, 5 mm, 10 mm, 20 mm, 50 mm, or other thicknesses sufficient to protect the product 102 from certain environmental factors (e.g., abrasion, exposure to humidity, exposure to electricity such as static electricity, ultra-violet penetration) that may damage the product 102 during the shipping of the product 102. The testing encapsulation 104b may be 1 mil, 2 mil, 5 mil, 10 mil, 20 mil, 50 mil, or other thicknesses sufficient to protect the product 102 from certain environmental factors (e.g., application of dimensional stress, abrasion, elevated electrical voltage, manual handling, fingerprints, stretching, bending, impact) that may damage the product 102 during the integration and/or testing of the product 102. The deployment encapsulation 104c may be 0.1 mil, 0.2 mil, 0.5 mil, 1 mil, 2 mil, 3 mil, 5 mil, or other thicknesses sufficient to protect the product 102 from certain environmental factors (e.g., abrasions, punctures, and/or humidity, ultra-violet penetration) while fulfilling certain criteria necessary for the deployment of the product 102 (e.g., lowest weight possible while still protecting the product 102 from abrasions, punctures, and humidity). In optional implementations, the optional deployment encapsulation 104d may be 0.1 mil, 0.2 mil, 0.5 mil, 1 mil, 2 mil, 3 mil, 5 mil, or other thicknesses. The optional deployment encapsulation 104d may be exposed (by removing the deployment encapsulation 104c) after a certain amount of time, after certain damage or wear-and-tear to the deployment encapsulation 104c, or the product 102 has been repurposed or refurbished (e.g., for the same or different applications).

In some instances, the plurality of encapsulations 104 may have different optical properties, such as transparencies. For example, the shipping encapsulation 104a may be opaque or substantially opaque to protect the product 102 from illumination of radiations during the shipping process. The testing encapsulation 104b may be transparent or substantially transparent to allow for the testing and/or integration of the product 102 (e.g., testing the quantum efficiency of a solar cell or testing the integration of the solar cell into a HALE/UAV system). The deployment encapsulation 104c may be transparent or substantially transparent to allow for the deployment of the product 102. In optional implementations, the optional deployment encapsulation 104d may be transparent or substantially transparent. In some implementations, some or all of the plurality of encapsulations 104 may be transparent, substantially transparent, semi-transparent, opaque, or substantially opaque.

In some implementations, the plurality of encapsulations 104 may have different mechanical (e.g., malleability, density/weight, compression modulus, tensile modulus, shear modulus, hardness), electrical (e.g., conductivity), chemical (e.g., chemical resistance, glass transition temperature, melting temperature), rheological (e.g., scratch resistance, or gas/fluid permeability), and/or optical (e.g., transparency) characteristics. For example, the shipping encapsulation 104a may have higher shear modulus, chemical resistance, and/or gas/fluid permeability and lower transparency and conductivity than the deployment encapsulation 104c.

In one aspect of the present disclosure, the shipping encapsulation 104a may include an opaque low-tack pressure sensitive adhesive (PSA). The testing encapsulation 104b may include a transparent or substantially transparent PSA having a higher tack than the shipping encapsulation 104a and a thickness of 5 mil. The deployment encapsulation 104c may include a transparent or substantially transparent PSA having a higher tack than the testing encapsulation 104b and a thickness of 0.5 mil. The optional deployment encapsulation 104d may include a transparent or substantially transparent PSA having a higher tack than the testing encapsulation 104b and a thickness of 3 mil.

In some examples, the plurality of encapsulations 104 may include the same or different materials. Examples of the materials for one or more of the plurality of encapsulations 104 include polypropylene, silicone, polyester, polyimide, polyethylene, acrylic, rubber, polystyrene, fluoropolymers (including but not limited to ETFE, FEP, PVF, PVDF) or other materials suitable for protecting the product 102.

In certain instances, the plurality of encapsulations 104 may adhere to the product 102 and/or each other via pressure sensitive adhesive, thermoplastic adhesive, electrostatic force, Van der Waals force, or other means.

In some variations, one or more of the plurality of encapsulations 104 may be detachably adhered to, sprayed onto, and/or spin-coated onto the product and/or each other.

Figure 2:
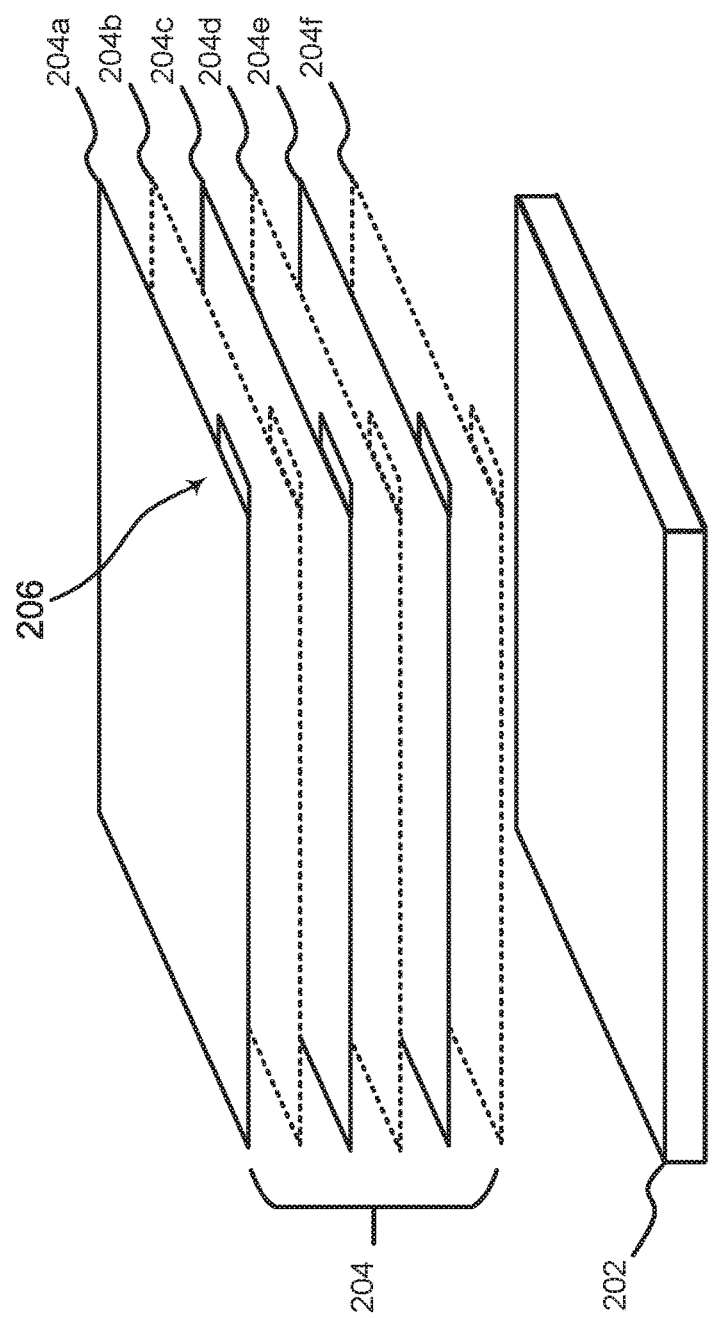
FIG. 2 is a second example of a packaged product according to certain aspects of the present disclosure.

Turning to FIG. 2, an example of another implementation of the present disclosures includes an encapsulated product 200. The encapsulated product 200 may include a product 202 such as a semiconductor device (e.g., a solar cell panel, a display, etc.). In some implementations, the encapsulated product 200 may include a plurality of encapsulations 204. The plurality of encapsulations 204 may include one or more of a shipping encapsulation 204a, a first optional adhesive layer 204b, a testing encapsulation 204c, a second optional adhesive layer 204d, a deployment encapsulation 204e, and a third optional adhesive layer 204f. The plurality of encapsulations 204 may be installed sequentially. For example, the third optional adhesive layer 204f may be deposited first, followed sequentially by the deployment encapsulation 204e, the second optional adhesive layer 204d, the testing encapsulation 204c, the first optional adhesive layer 204b, and the shipping encapsulation 204a. The first, second, and third optional adhesive layer 204b, 204d, 204f may provide adhesion among the shipping encapsulation 204a, testing encapsulation 204c, the deployment encapsulation 204e, and/or the product 202. In other examples, the plurality of encapsulations 204 may detachably adhere to the product 202 at the same time.

In a non-limiting example, the plurality of encapsulations 204 may include a plurality of tabs 206. The plurality of tabs 206 may enable the removal of one or more of the plurality of encapsulations 204 from the encapsulated product 200. In some instances, the plurality of tabs 206 may be placed in different locations for different encapsulation layers of the plurality of encapsulations 204. In other examples, the plurality of tabs 206 may have different colors, sizes, and/or labels for different encapsulation layers of the plurality of encapsulations 204.

In certain implementations, the plurality of encapsulations 204 may include markers (e.g., words, phrase, symbols, alphanumeric characters, bar code, QR code, etc.) indicating the shipping encapsulation 104a, the testing encapsulation 104b, the deployment encapsulation 104c, and/or the optional deployment encapsulation 104d. For example, the shipping encapsulation 104a may include the words "shipping encapsulation," the testing encapsulation 104b may include the words "testing encapsulation," the deployment encapsulation 104c may include the words "testing encapsulation," and so forth. In other instances, the shipping encapsulation 104a may include a small truck symbol to indicate the shipping encapsulation 104a.

In another example, at least a portion of the shipping encapsulation 104a, the testing encapsulation 104b, the deployment encapsulation 104c, and/or the optional deployment encapsulation 104d may have different colors. For example, a corner of the shipping encapsulation 104a may be black, a corner of the testing encapsulation 104b may red, a corner of the deployment encapsulation 104c may be yellow, and so forth. The colors may be chosen to not interfere with the functionalities of the plurality of encapsulations 104 (e.g., the shipping encapsulation 104a may be opaque).

Other methods to represent the plurality of encapsulation 104 and/or delineate one encapsulation layer from another may be used, such as physical characteristics of the plurality of encapsulations 104 (e.g., thickness, transparency, material), locations/shapes of the plurality of tabs 206, shapes of the plurality of encapsulation 104 (e.g., the shipping encapsulation 104a may have rounded corners and the deployment encapsulation 104c may have sharp corners), etc.

In some implementations, the product 102 may include a laminate. The plurality of encapsulation 104 may be disposed on top of the laminate.

Figure 3A:
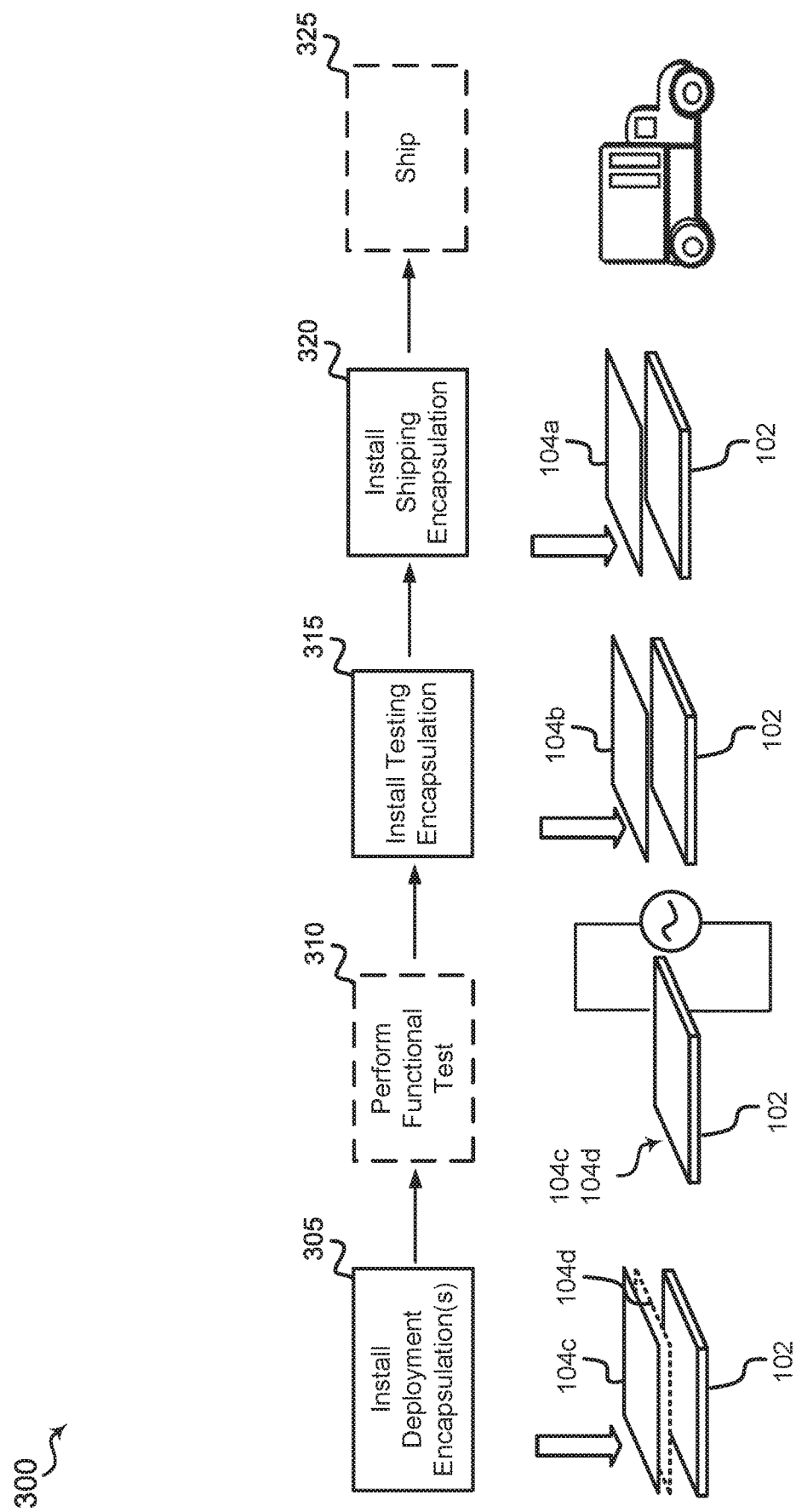
FIG. 3A is an example of process flow diagram for adding the encapsulations according to certain aspects of the present disclosure.

Referring to FIG. 3A, an example of a method 300 for installing encapsulations may be automated, performed manually, or a combination of the two.

At block 305, the method 300 may install one or more deployed encapsulations. For example, two deployed encapsulations may be installed. For example, the deployment encapsulation 104c and the optional deployment encapsulation 104d may be installed onto the product 102. In optional implementations, a detachable or non-detachable base encapsulation may be installed onto the product 102 before the deployment encapsulation 104c and/or the optional deployment encapsulation 104d.

At block 310, the method 300 may optionally perform functional test. For example, a functional test may be performed on the product 102 having the deployment encapsulation 104c and/or the optional deployment encapsulation 104d.

At block 315, the method 300 may install a testing encapsulation. For example, the testing encapsulation 104c may be installed onto the product 102 over the deployment encapsulation 104c and/or the optional deployment encapsulation 104d.

At block 320, the method 300 may install a shipping encapsulation. For example, the testing encapsulation 104c may be installed onto the product 102 over the testing encapsulation 104b, the deployment encapsulation 104c, and/or the optional deployment encapsulation 104d.

At block 325, the method 300 may optionally ship the product. For example, the product 102 may be shipped with one or more of the plurality of encapsulation 104.

Figure 3B:
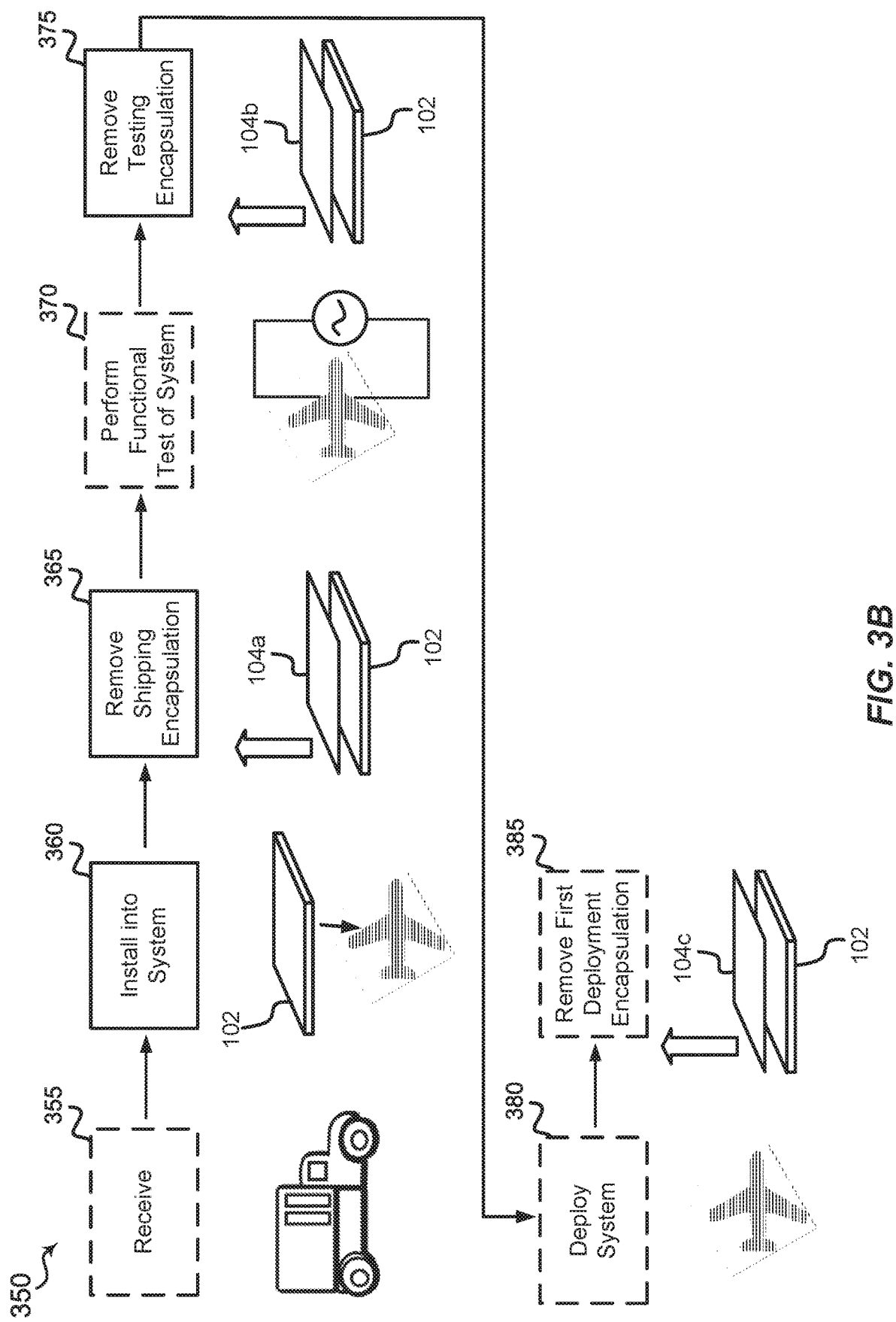
FIG. 3B is an example of process flow diagram for removing the encapsulations according to certain aspects of the present disclosure.

Turning now to FIG. 3B, an example of a method 350 for removing encapsulations may be automated, performed manually, or a combination of the two.

At block 355, the method 350 may optionally receive the product. For example, the product 102 may be received with one or more of the plurality of encapsulation 104.

At block 360, the method 350 may install the product into a system. For example, the product 102 may be installed into a high altitude long endurance vehicle or an unmanned aerial vehicle.

At block 365, the method 350 may remove the shipping encapsulation. For example, the shipping encapsulation 104a may be removed.

At block 370, the method 350 may optionally perform the function test on the system. For example, the function test may be performed on the high altitude long endurance vehicle or the unmanned aerial vehicle.

At block 375, the method 350 may remove the testing encapsulation. For example, the testing encapsulation 104b may be removed.

At block 380, the method 350 may optionally deploy the system. For example, the high altitude long endurance vehicle or the unmanned aerial vehicle may be deployed.

At block 385, the method 350 may optionally remove the first deployment encapsulation. For example, the deployment encapsulation 104c may be removed from the product 102 after the deployment of the high altitude long endurance vehicle or the unmanned aerial vehicle. In some cases, the deployment encapsulation 104c may be removed from the product 102 when the product 102 is refurbished.

Figure 4:
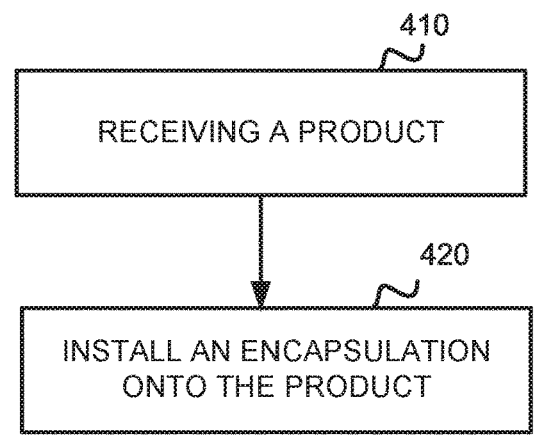
FIG. 4 is an example of a process flow diagram for encapsulating a product according to certain aspects of the present disclosure.

Referring to FIG. 4, an example of a method 400 for installing encapsulations may be automated, performed manually, or a combination of the two.

At block 410, the method 400 may receive a product, such as the product 102 or the product 202.

At block 420, the method 400 may install an encapsulation onto the product. For example, one or more of the plurality of encapsulations 104, 204 may be installed onto the products 102 or the product 202.

Figure 5:
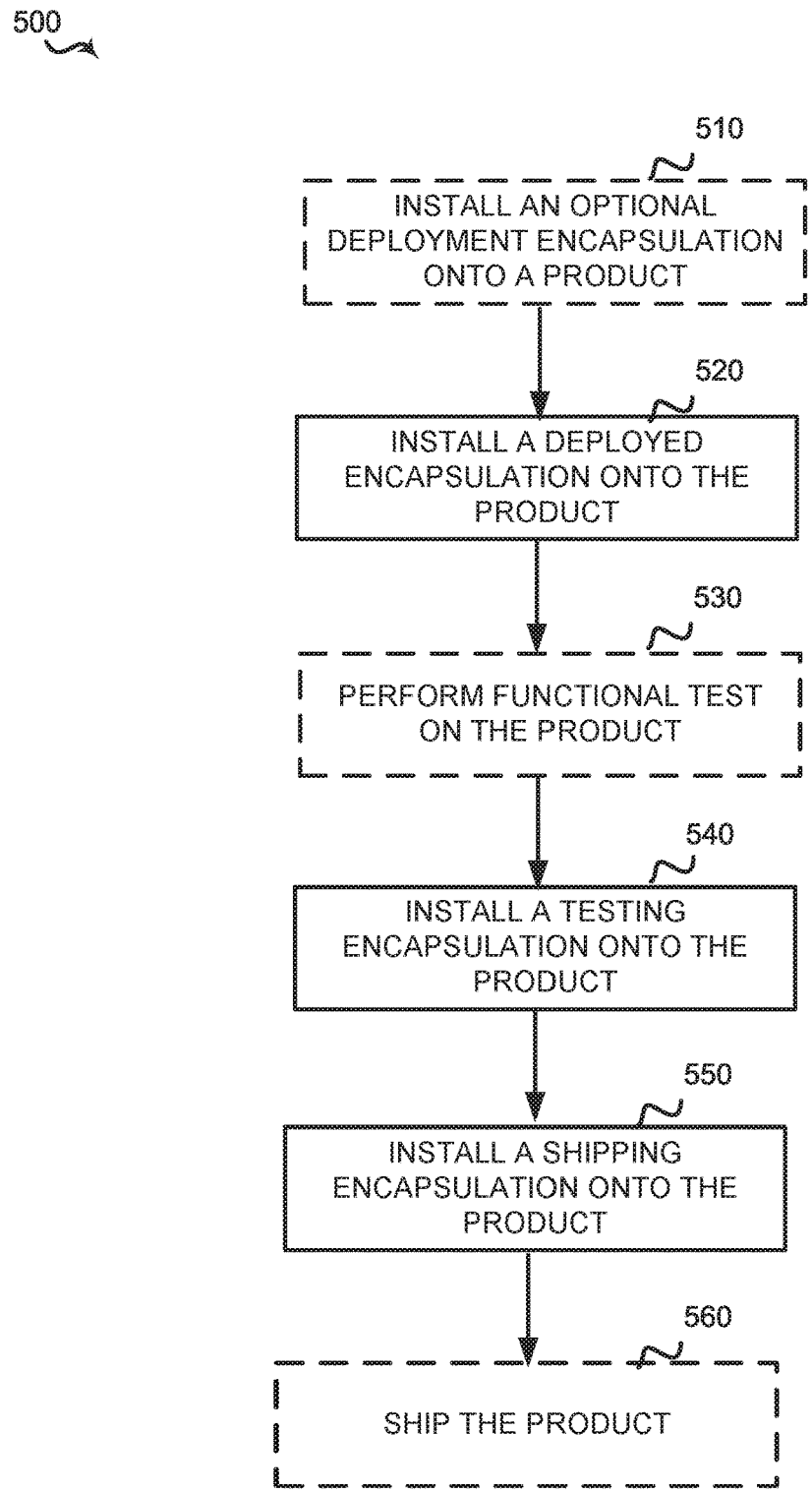
FIG. 5 is an example of a process flow diagram for encapsulating a product according to certain aspects of the present disclosure.

Referring to FIG. 5, an example of a method 500 for installing encapsulations may be automated, performed manually, or a combination of the two. The method 500 may include optionally receiving a product.

At block 510, the method 500 may install an optional deployment encapsulation, such as the optional deployment encapsulation 105*d*, onto a product, such as the product 102 or the product 202.

At block 520, the method 500 may install a deployment encapsulation, such as the deployment encapsulation 105*c* or the deployment encapsulation 205*e*, onto the product, such as the product 102 or the product 202.

At block 530, the method 500 may optionally perform a functional test on the product, such as the product 102 or the product 202. The functional test may include testing the mechanical, electrical, optical, and/or chemical properties of the product 102, 202, or the system into which the product is installed.

At block 540, the method 500 may install a testing encapsulation, such as the testing encapsulation 105*b* or the testing encapsulation 205*c*, onto the product, such as the product 102 or the product 202.

At block 550, the method 500 may install a shipping encapsulation, such as the shipping encapsulation 105*a* or the shipping encapsulation 205*a*, onto the product, such as the product 102 or the product 202.

At block 560, the method 500 may optionally ship the product.

Figure 6:
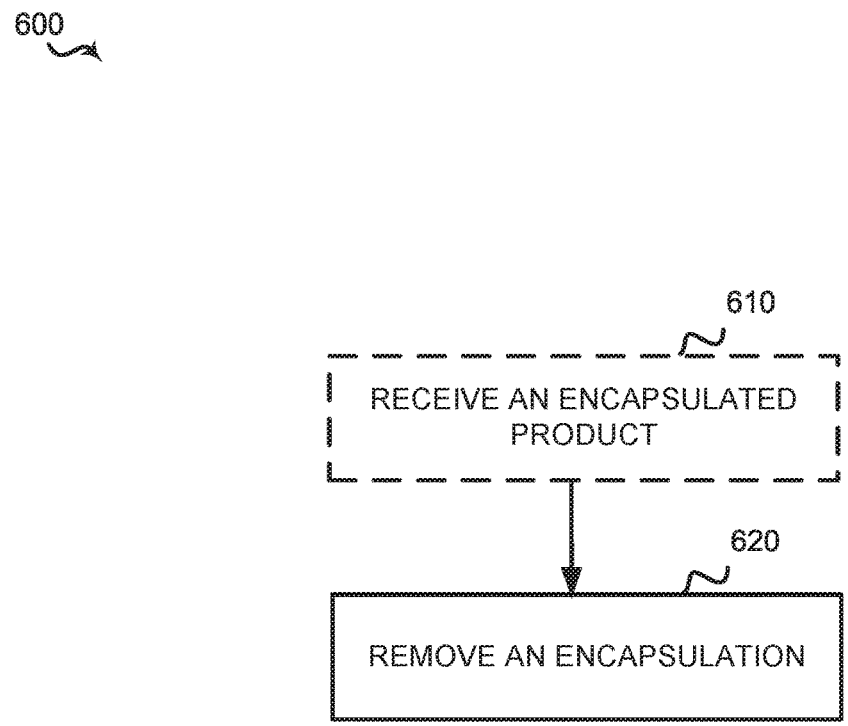
FIG. 6 is an example of a process flow diagram for removing an encapsulation from an encapsulated product according to certain aspects of the present disclosure.

Referring to FIG. 6, an example of a method 600 for removing encapsulations may be automated, performed manually, or a combination of the two.

At block 610, the method 600 may receive an encapsulated product, such as the encapsulated product 100 or the encapsulated product 200.

At block 620, the method 600 may remove an encapsulation, such as one or more of the plurality of encapsulations 104, 204.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A packaged product, comprising:
   an optoelectronic product;
   a first encapsulation disposed on top of the optoelectronic product, wherein the first encapsulation is configured to protect the product during an operation of the optoelectronic product;
   a second encapsulation disposed on top of the first encapsulation, wherein the second encapsulation is configured to protect the product during a testing of the optoelectronic product; and
   a third encapsulation disposed on top of the second encapsulation, wherein the third encapsulation is configured to protect the product during a transport of the optoelectronic product.

2. The packaged product of claim 1, wherein the first encapsulation is detachably coupled with the optoelectronic product, the second encapsulation is detachably coupled with the first encapsulation, and the third encapsulation is detachably coupled with the second encapsulation.

3. The packaged product of claim 1, wherein the third encapsulation is configured to be removed after the transport of the optoelectronic product to provide protection to the optoelectronic product while being transported.

4. The packaged product of claim 3, wherein the second encapsulation is configured to be removed after the testing of the product to provide protection to the optoelectronic product while being tested.

5. The packaged product of claim 1, further comprising a fourth encapsulation disposed between the optoelectronic product and the first encapsulation, wherein the fourth encapsulation is configured to protect the optoelectronic product during the operation of the optoelectronic product.

6. The packaged product of claim 5, wherein the first encapsulation is configured to be removed after a duration of operation of the optoelectronic product with the fourth encapsulation remaining for protection of the optoelectronic product after the first encapsulation is removed.

7. The packaged product of claim 1, further comprising one or more adhesion layers between at least one of the optoelectronic product and the first encapsulation, the first encapsulation and the second encapsulation, or the second encapsulation and the third encapsulation.

8. The packaged product of claim 1, wherein at least one of the first encapsulation, the second encapsulation, or the third encapsulation comprises of polypropylene, silicone, polyester, polyethylene, acrylic, rubber, fluoropolymer, or polystyrene.

9. The packaged product of claim 1, wherein the first encapsulation is between 0.1 mil and 5 mil.

10. The packaged product of claim 1, wherein the second encapsulation is between 1 mil and 50 mil.

11. The packaged product of claim 1, wherein the third encapsulation is between 0.1 millimeter and 50 millimeters.

12. The packaged product of claim 1, wherein the third encapsulation is opaque and the first encapsulation is transparent.

13. The packaged product of claim 1, wherein the optoelectronic product is a solar cell or a light emitting cell.

14. The packaged product of claim 1, wherein the optoelectronic product is a flexible matrix that includes multiple solar cells or multiple light emitting cells made of silicon or group III-V semiconductor materials.

15. The packaged product of claim 1, wherein at least one of the first encapsulation, the second encapsulation, or the third encapsulation includes a tab for removing the at least one of the first encapsulation, the second encapsulation, or the third encapsulation.

16. The packaged product of claim 1, wherein at least one of the first encapsulation, the second encapsulation, or the third encapsulation includes a marker indicating the first encapsulation, the second encapsulation, or the third encapsulation.

17. The packaged product of claim 1, wherein the packaged product is attachable to a high altitude long endurance vehicle or a unmanned aerial vehicle.

18. A packaging for use with an optoelectronic product, comprising:

a first encapsulation disposed on top of the optoelectronic product, wherein the first encapsulation is configured to protect the product during an operation of the optoelectronic product;

a second encapsulation disposed on top of the first encapsulation, wherein the second encapsulation is configured to protect the product during a testing of the optoelectronic product; and a third encapsulation disposed on top of the second encapsulation, wherein the third encapsulation is configured to protect the product during a transport of the optoelectronic product.

19. The packaging of claim 18, wherein the first encapsulation is detachably coupled with the optoelectronic product, the second encapsulation is detachably coupled with the first encapsulation, and the third encapsulation is detachably coupled with the second encapsulation.

20. The packaging of claim 18, wherein:

the third encapsulation is configured to be removed after the transport of the optoelectronic product to provide protection to the optoelectronic product while being transported; and the second encapsulation is configured to be removed after the testing of the product to provide protection to the optoelectronic product while being tested.

* * * * *